(12) United States Patent
Colombo

(10) Patent No.: US 7,544,620 B2
(45) Date of Patent: Jun. 9, 2009

(54) PROCESS FOR DIGGING A DEEP TRENCH IN A SEMICONDUCTOR BODY AND SEMICONDUCTOR BODY SO OBTAINED

(76) Inventor: Roberto Colombo, Via Varese, 8, 20030, Lentate Sul Seveso (IT)

(*) Notice: Subject to any disclaimer, the term of this patent is extended or adjusted under 35 U.S.C. 154(b) by 119 days.

(21) Appl. No.: 11/648,838

(22) Filed: Dec. 28, 2006

(65) Prior Publication Data

US 2007/0190743 A1 Aug. 16, 2007

(30) Foreign Application Priority Data

Dec. 28, 2005 (EP) .................................. 05425930

(51) Int. Cl.
*H01L 21/461* (2006.01)
(52) U.S. Cl. .................. 438/695; 438/689; 257/622; 257/E21.553
(58) Field of Classification Search .............. 438/689, 438/695; 257/622, E21.553
See application file for complete search history.

(56) References Cited

U.S. PATENT DOCUMENTS

| | | | |
|---|---|---|---|
| 6,187,685 B1 | 2/2001 | Hopkins et al. | |
| 6,261,962 B1* | 7/2001 | Bhardwaj et al. | ............ 438/702 |
| 6,284,148 B1 | 9/2001 | Laermer et al. | |
| 7,354,786 B2* | 4/2008 | Benzel et al. | ................. 438/50 |
| 2003/0168711 A1* | 9/2003 | Villa et al. | ................... 257/506 |
| 2004/0198064 A1* | 10/2004 | Subramanian et al. | ...... 438/719 |
| 2005/0048789 A1* | 3/2005 | Merry et al. | ................. 438/723 |

FOREIGN PATENT DOCUMENTS

| | | |
|---|---|---|
| EP | 0822582 A2 | 2/1998 |
| EP | 0964456 A2 | 12/1999 |
| EP | 1376683 | 1/2004 |

OTHER PUBLICATIONS

European Search Report, EP 05425930, May 10, 2006.

* cited by examiner

*Primary Examiner*—Asok K Sarkar
*Assistant Examiner*—Julia Slutsker
(74) *Attorney, Agent, or Firm*—Schwabe Williamson & Wyatt

(57) ABSTRACT

A process for digging deep trenches in a body of semiconductor material includes forming a mask having an opening, above a surface of a semiconductor body. A passivating layer is conformally formed on the mask and on the semiconductor body within the opening. A directional etch is extended to first remove the passivating layer from on top of the semiconductor body and then etch the semiconductor body through the opening. Forming the passivating layer and executing the directional etch are carried out repeatedly in sequence so as to form a trench through the opening. A tapered portion of the trench is formed, which has a transverse dimension decreasing as a distance from the surface of the semiconductor body increases.

20 Claims, 5 Drawing Sheets

PROCESS FOR DIGGING A DEEP TRENCH IN A SEMICONDUCTOR BODY AND SEMICONDUCTOR BODY SO OBTAINED

PRIORITY CLAIM

This application claims priority from European patent application No. 05425930.4, filed Dec. 28, 2005, which is incorporated herein by reference.

TECHNICAL FIELD

The present invention relates to a process for digging a deep trench in a semiconductor body and semiconductor body so obtained.

BACKGROUND

As is known, in different processes of fabricating semiconductor devices, it is necessary to form deep trenches within a semiconductor wafer. In practice, trenches must be opened, which have a depth much greater than at least one transverse dimension. For this purpose, various methods have been developed, which enable removal of semiconductor material in a markedly directional way, which as a rule is perpendicular to the surface of the semiconductor wafer and is referred to as a "digging direction." The efficiency of etching in a direction transverse with respect to the digging direction is in principle negligible.

Frequently, however, conflicting requirements must be satisfied. In particular, favoring directionality of an etching step frequently leads to sacrificing speed, and vice versa.

To overcome the above drawback, a known method envisages alternation of etching steps, which are far from directional but very aggressive, and steps of passivation, which protect the structures surrounding the digging in a direction transverse to the etching direction. In practice, after forming a resist mask that exposes portions of the surface of a semiconductor wafer that are to be etched, a polymeric passivating layer is conformally deposited. The wafer is then immersed in an etching fluid, for example $SF_6$, which, after eliminating the passivating layer, etches the underlying structures. However, the passivating layer is more rapidly removed on the semiconductor material than on the resist and much more rapidly on the surfaces substantially parallel to the surface of the wafer than on the perpendicular surfaces. Consequently, the digging proceeds initially in a direction substantially perpendicular to the surface of the wafer and only to a minimal extent in a transverse direction. When the passivating layer has been almost completely removed, the etching process is interrupted and a new passivating layer is formed. A subsequent etching step will thus resume the process of aggression of the semiconductor material in a direction substantially perpendicular to the surface of the wafer, whereas the walls around the trench that is being formed are protected. By alternating the described etching and passivation steps, it is possible to safeguard the directionality of the etch as a whole and at the same time maintain a satisfactory speed.

Control of the etch in a direction transverse to the digging direction, however, is less and less precise as the depth increases and may become critical if it is necessary to form a plurality of trenches close to one another, separated by thin diaphragms of semiconductor material, as in the case of some processes of fabrication of SOI (Silicon On Insulator) wafers. As the depth increases, the deposition of the passivating layer is less effective, and hence the walls of the trenches are less protected. The etch, then, tends to lose directionality, and the trenches widen, whereas the diaphragms thin out towards the base, with the risk of collapsing. The initial thickness of the diaphragms (i.e., towards the surface of the wafer) must be oversized to prevent any failure. Furthermore, in order to favor polymerization and hence formation of the passivating layer, the process must be performed at temperatures that are significantly lower than the ones required for normal etching processes (below room temperature or even at temperatures lower than 0° C.), but for this purpose special machinery is required.

SUMMARY

Embodiments of the present invention provide a process for digging a deep trench in a body of semiconductor material and a semiconductor body that are free from at least some of the drawbacks described.

BRIEF DESCRIPTION OF THE DRAWINGS

For a better understanding of the invention, embodiments thereof will now be described purely by way of non-limiting example and with reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
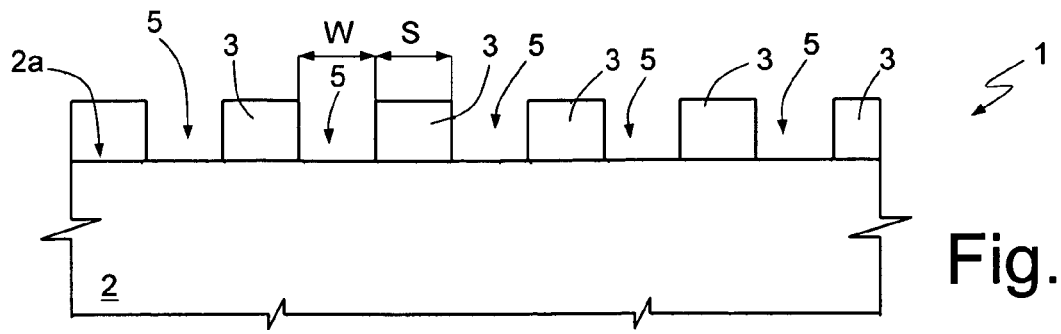
FIG. 1 shows a cross section through a semiconductor wafer, in an initial step of a process according to an embodiment of the present invention.
Figure 2:
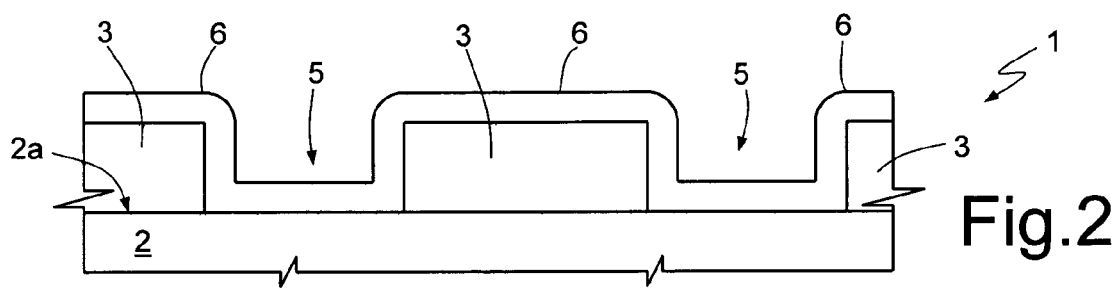
FIGS. 2-9 show an enlarged detail of the wafer illustrated in FIG. 1, in successive fabrication steps according to one embodiment of the present invention.

FIG. 1 illustrates a semiconductor wafer 1, e.g. of monocrystalline silicon, including a substrate 2. On a (horizontal) surface 2a of the substrate 2, a resist mask 3 is initially deposited and shaped. The mask 3 has a plurality of rectilinear openings 5, arranged parallel to one another and extending in a direction perpendicular to the plane of the drawing. The openings 5 all have a same width W. for example equal to 1 µm, and are evenly spaced apart. Preferably, the spacing S between adjacent openings 5 is substantially equal to the width W As illustrated in the enlargement of FIG. 2, a passivating layer 6 of polymeric material is formed on the wafer 1. More precisely, the passivating layer 6 is conformally deposited and coats the mask 3 and the substrate 2 where this is left exposed, i.e., within the openings 5, with a substantially constant thickness. Also the surfaces perpendicular to the surface 2a of the substrate 2 (vertical) are coated with the passivating layer 6.

Subsequently, a directional etch is carried out using an aggressive agent, preferably $SF_6$. In this step, the etching rate is favored as against the directionality.

Figure 3:
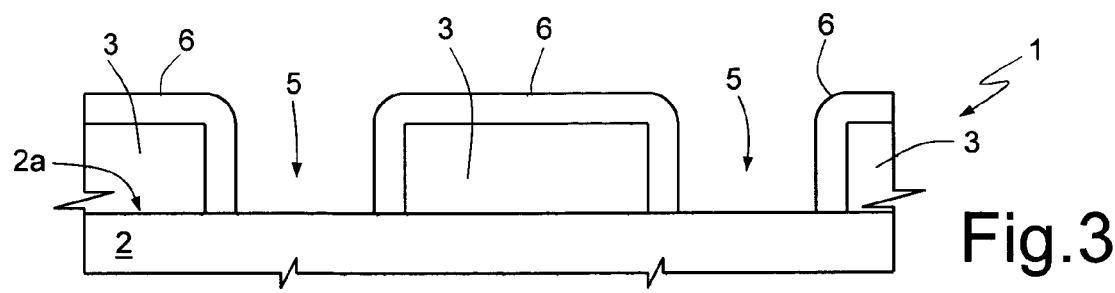

In FIG. 3, an intermediate step of the directional etch is illustrated. As may be noted, the passivating layer 6 is gradually eliminated, but not in a uniform way. In particular, removal is faster within the openings 5 of the mask 3, where the passivating layer 6 is in direct contact with the silicon, which is thus exposed more rapidly than the mask 3. Furthermore, the removal of the passivating layer 6 is much slower on the vertical surfaces than on the horizontal ones (respectively perpendicular and parallel to the surface 2a of the substrate 2). Consequently, the silicon of the substrate 2 starts to be etched through the openings 5 before the mask 3 is completely exposed. In this step, the passivating layer 6 protects the mask 3 to prevent it from being completely removed before the end of the digging process.

Figure 4:
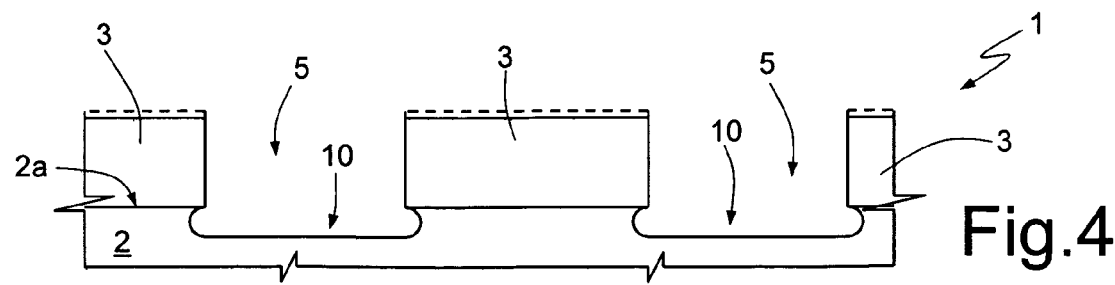

As the directional etch proceeds (FIG. 4), the substrate 2 is principally dug in a direction perpendicular to the surface 2a, and trenches 10 start to form. However, given that the etching agent has been chosen so as to privilege rapidity over directionality, the trenches 10 tend to expand also in a transverse direction with respect to the principal direction of etching. The directional etch terminates after the passivating layer 6 has been completely removed and the trenches 10 have reached a pre-set depth. Furthermore, the mask 3 has been slightly eroded.

Figure 5:
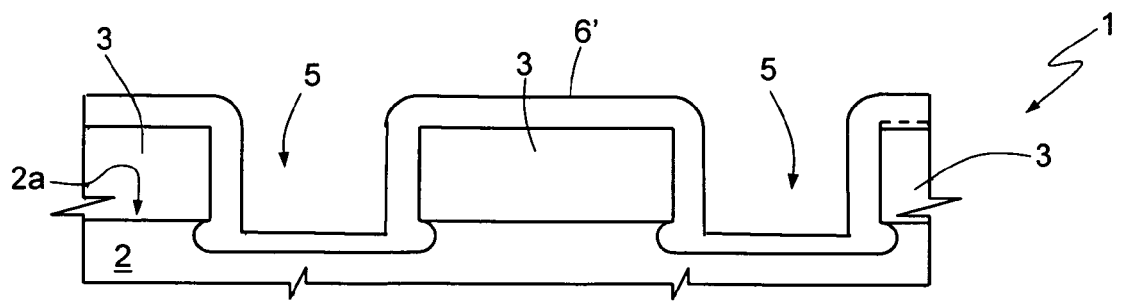
Figure 6:
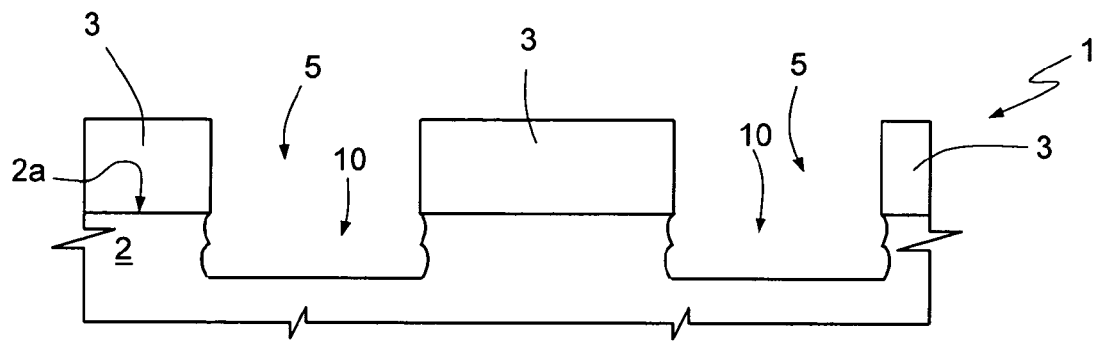

Subsequently, a new passivating layer 6' is conformally deposited, which coats the mask 3 and the surfaces that delimit the trenches 10, as illustrated in FIG. 5. Then (FIG. 6), the wafer 1 is again directionally etched through the openings 5 of the mask 2, until the passivating layer 6' has been completely removed.

Figure 7:
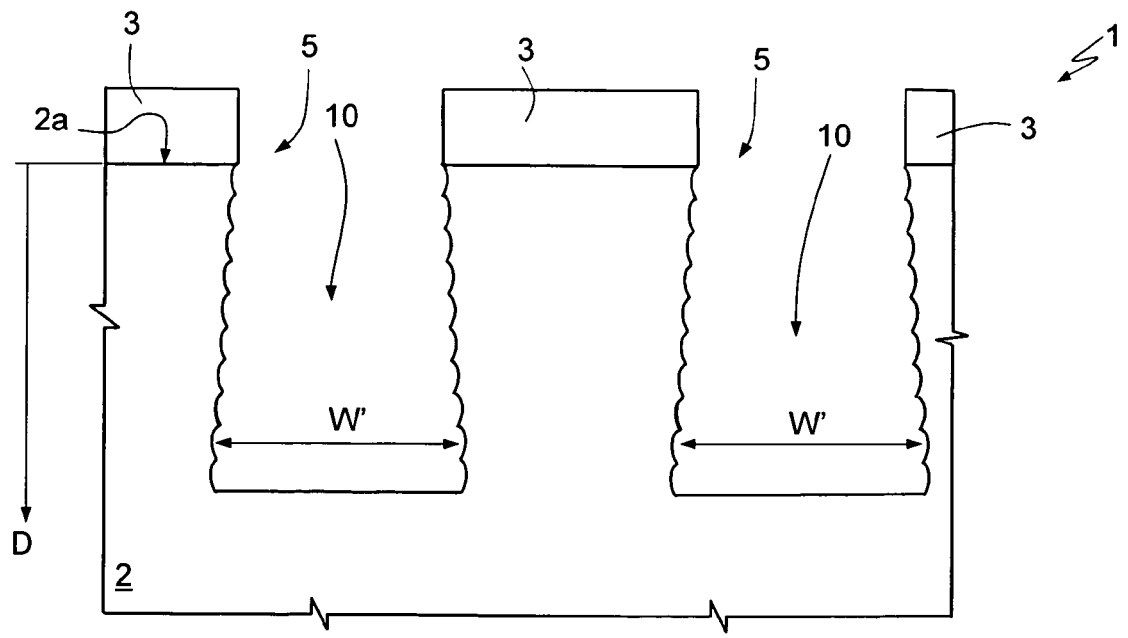

The steps of passivation and of directional etching through the openings 5 are repeated in sequence for a desired or predetermined number of times (for example eight times, as illustrated in FIG. 7). The depth of the trenches 10 increases substantially by the same amount at each iteration of the directional etch, and the side surfaces 10a (FIG. 8) that delimit the trenches 10 assume a corrugated profile. However, the passivation becomes less effective as the depth increases, and hence the side surfaces 10a are less protected during the etching operations. Consequently, spacer portions 10', of the trenches 10 dug up to this moment have a width W that on average increases (considering the corrugated profile of the side surfaces 10a) as the depth D, i.e., the depth of the distance from the surface 2a of the substrate 2, increases.

Figure 8:
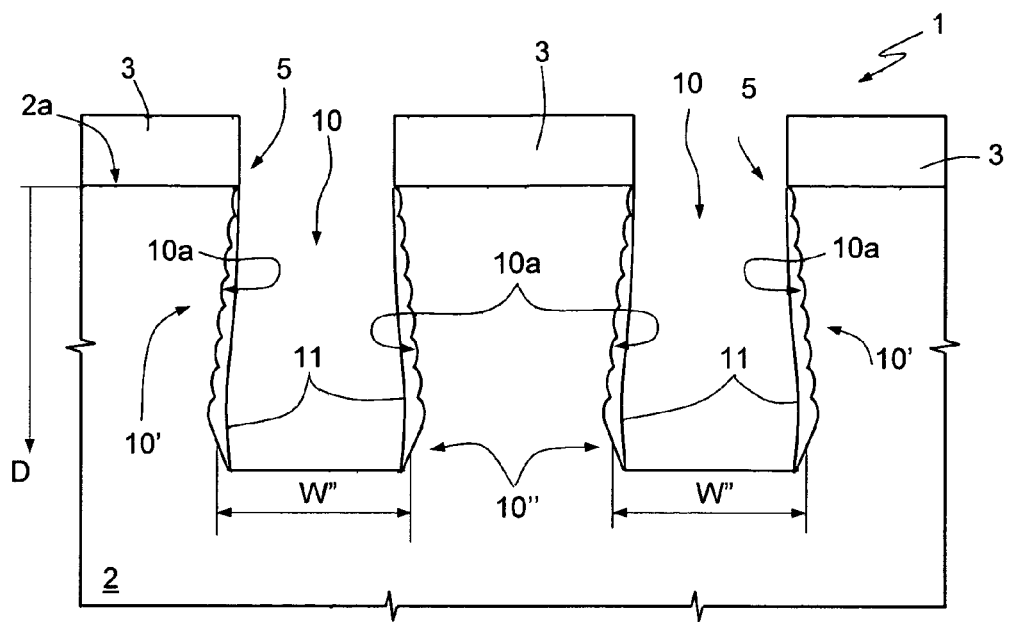
Figure 9:
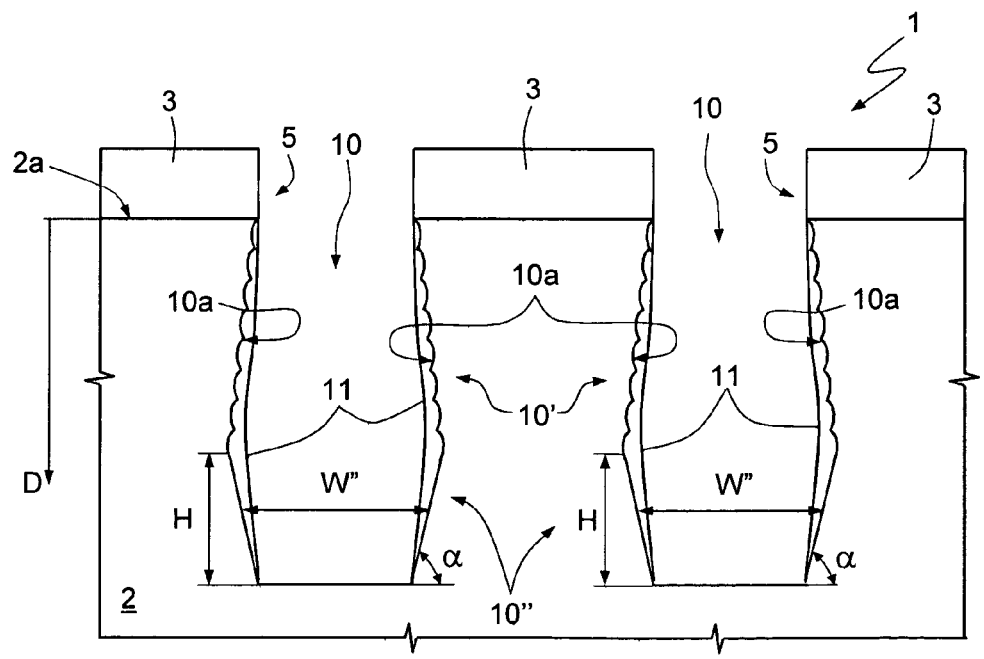

With reference to FIGS. 8 and 9, after the sequences of passivation and directional etching have been repeated for the pre-set number of times, tapered portions 10" of the trenches 10 are formed, which have a width W' decreasing as the depth D increases. For this purpose, a polymerizing plasma etch is carried out, in controlled plasma conditions, through the openings 5 of the mask 3. The polymerizing etch is preferably an STI (Shallow Trench Isolation) etch, which, however, is performed starting from a trench already partially formed, instead of directly on the surface 2a of the substrate 2. In this step, a process as described in European Patent No. EP-A-1 376 683, filed in the name of the present assignee and incorporated herein by reference, can be used.

In this step, the etching speed is much slower than before and, in a transverse direction with respect to the principal direction of etching, the rate of deposition of polymeric material prevails over the rate of removal. As the etching operation proceeds, the side surfaces 10a of the trenches 10 are then coated with a protective layer 11 of increasing thickness, and hence the exposed part of the substrate 2 narrows. Consequently, the width W' of the tapered portion 10" gradually diminishes.

During the polymerizing etch, the composition and conditions of the plasma (pressure, temperature, voltage with respect to the wafer 1, RF power) are selected so that the side surfaces 10a of the tapered portion 10" of the trench 10 have an angle of inclination $\alpha$ which is controlled and preferably constant with respect to the surface 2a of the substrate 2, irrespective of the depth D (FIG. 9). For example, the angle of inclination $\alpha$ is equal to approximately 85°. Furthermore, the height H of the tapered portions 10" is such that the inclination of the side surfaces 10a compensates for the widening of the portions of the overlying trenches 10 with respect to the width of the openings 5 of the mask 3.

Once the polymerizing etch is terminated, the structure illustrated in FIG. 9 is obtained.

Figure 9A:
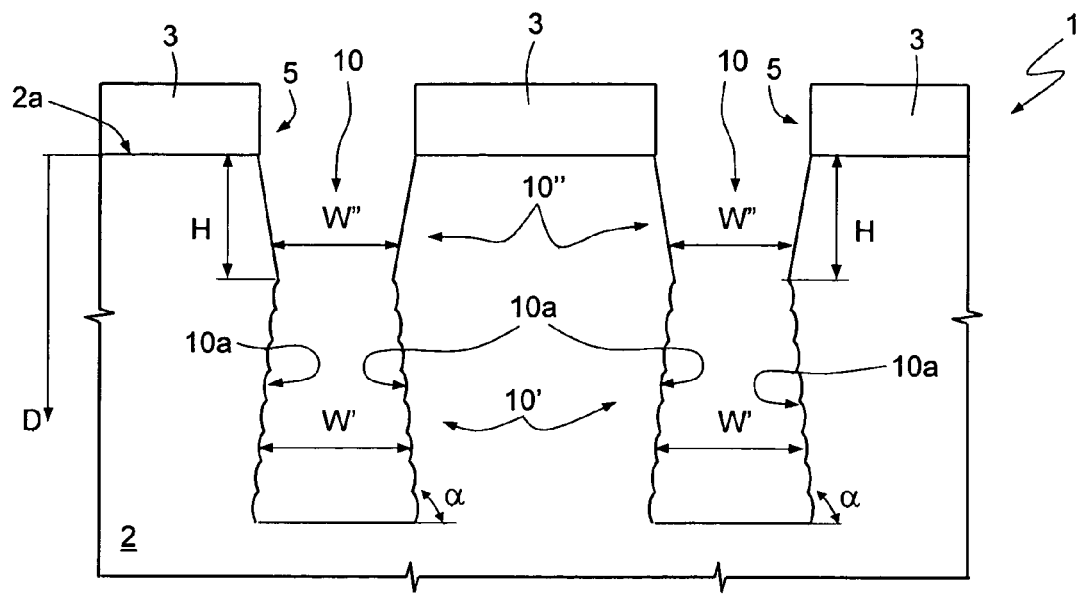
FIG. 9a shows a process according to another embodiment of the invention.

A first digging cycle is thus concluded, which comprises the steps described above: first steps of passivation and of directional etch carried out in sequence a predetermined number of times to form a spacing portion 10'; and then a polymerizing etching step to form the tapered portions 10" of the trenches 10. According to a another embodiment of the present invention, as shown in FIG. 9a, the polymerizing etch is performed before the sequence of steps of passivation and directional etch. This solution provides for the creation of a protective layer already during the first etching steps and is particularly effective when the maintenance of the transverse dimensions right from the start of the digging operation is of a critical nature.

Figure 10:
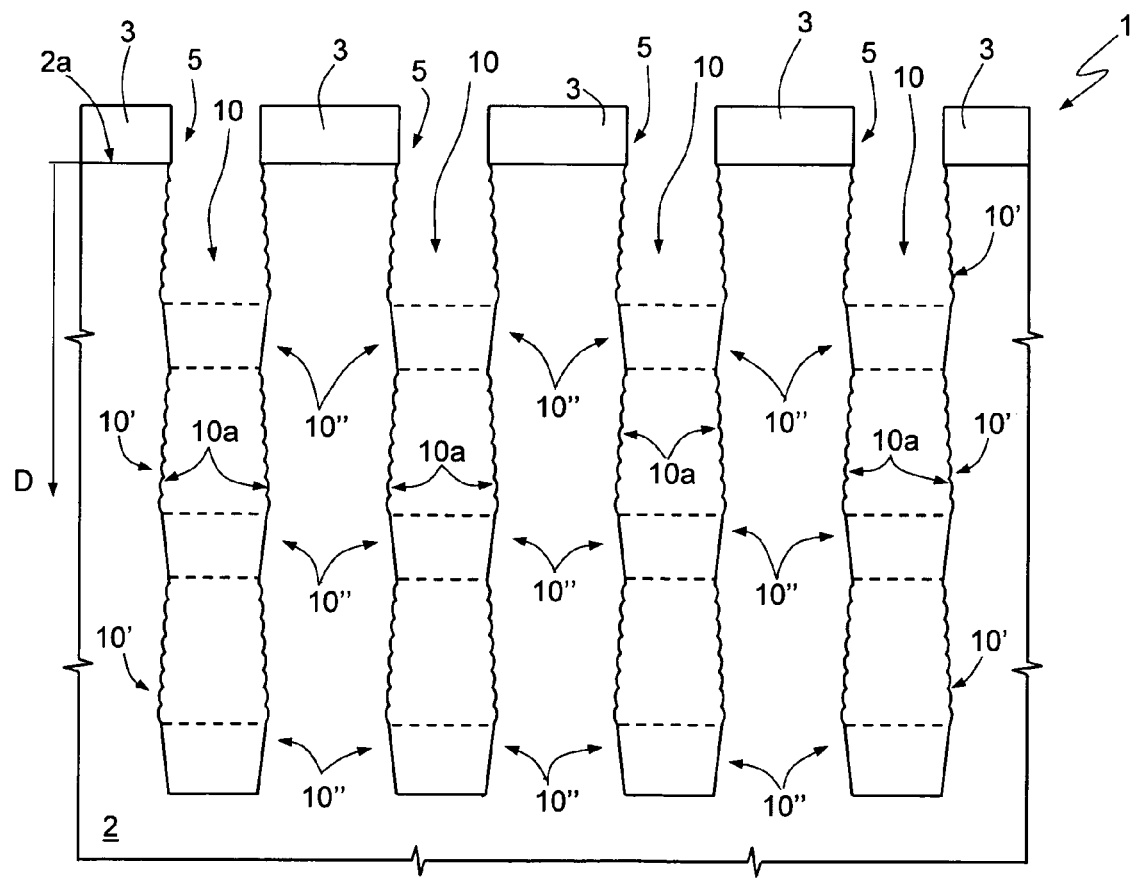
FIGS. 10-15 show the view of FIGS. 1-9 in final fabrication steps of the process of FIGS. 1-9 repeated several times according to an embodiment of the present invention.

Subsequently (FIG. 10), further digging cycles are carried out identical to the first digging cycle described above, until the trenches 10 have a desired depth. In the example illustrated in FIG. 10, three digging cycles have been carried out in all. Consequently, each of the trenches 10 comprises three respective tapered portions 10", each of which has a width W" decreasing as the depth D increases with respect to the surface 2a of the substrate 2.

Figure 11:
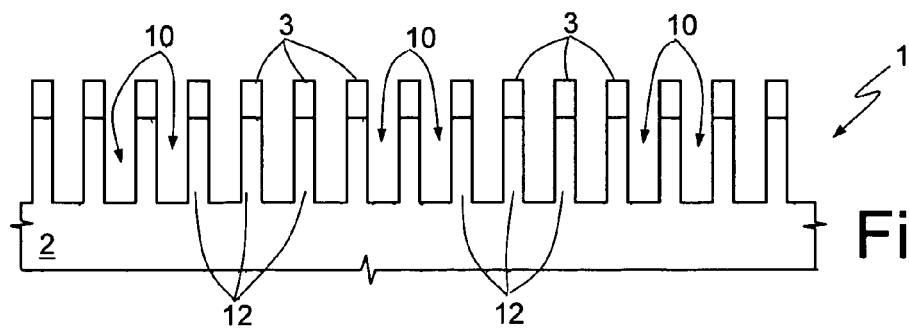
Figure 12:
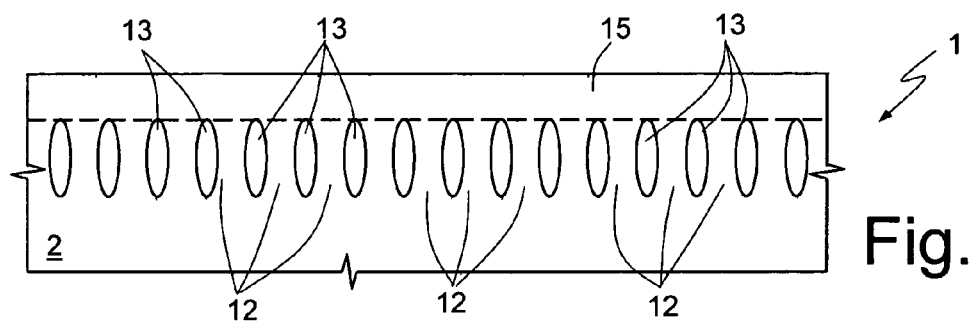

At this point, adjacent trenches 10 define diaphragms 12, arranged so as to form a comb-like structure, as illustrated in FIG. 11 (for reasons of simplicity, the side surfaces 10a of the trenches 10 are herein illustrated as if they were vertical). After removal of the mask 3 and possible residue of polymeric material within the trenches 10 (FIG. 12), an epitaxial layer 15 is grown, which closes the trenches 10 at the top, filling them partially and forming buried cavities 13. The epitaxial growth is carried out in a deoxidizing environment, rich in hydrogen molecules, which are trapped within the buried cavities 13.

Figure 13:
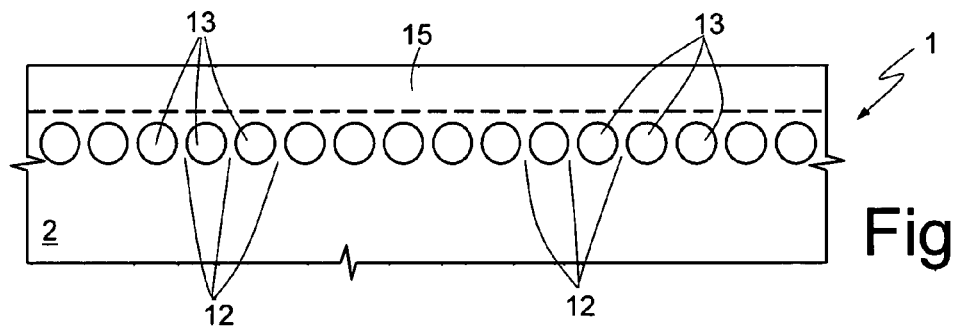

By exploiting the deoxidizing environment within the buried cavities 13, a thermal step of annealing is then executed (FIG. 13). In practice, the wafer 1 is heated at a controlled temperature for a predetermined period of time (for example, 1150° C. for 1 h). In these conditions, the semiconductor material forming the diaphragms 12 is subject to migration and tends to redistribute according to a configuration of minimum energy, maintaining in any case the order of the monocrystal. In practice, the diaphragms 12 tend to thin out and, at the same time, the height of the buried cavities 13 decreases slightly.

Figure 14:
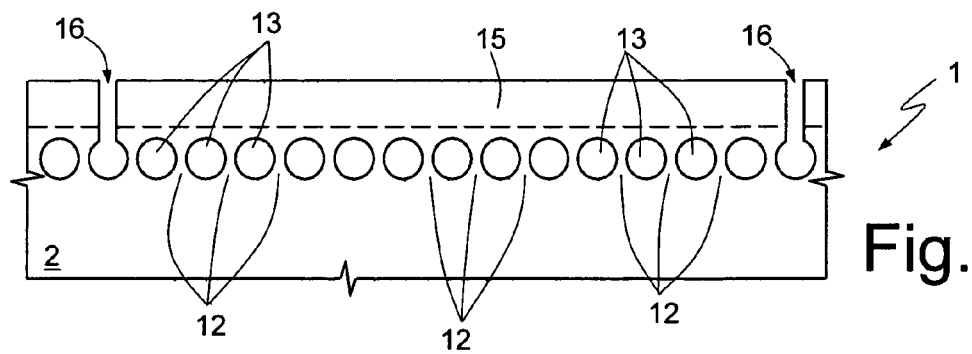
Figure 15:
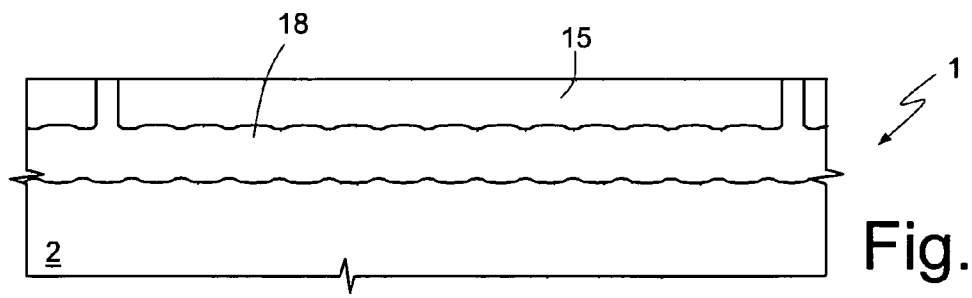

Next (FIG. 14), access openings 16 are provided for supplying oxygen to the buried cavities 13 (further access openings, not illustrated, extend in a perpendicular direction, forming a lattice, so that all the buried cavities 13 will be reachable from outside). A thermal oxidation is then carried out, where the diaphragms 12 are completely oxidized, and the buried cavities 13 fill up with silicon oxide. Consequently, at the end of the oxidation process, a buried dielectric layer 18 is obtained, as illustrated in FIG. 15. The buried dielectric layer 18 extends over all the substrate 2, separating it from the epitaxial layer 15.

The process described is advantageous because it enables deep trenches with a substantially constant width to be obtained rapidly, preventing significant deviations with respect to a desired width. In particular, the process described can be advantageously used when it is necessary to define thin diaphragms, having a height much greater than the thickness. In this case, in fact, the thickness of the diaphragms can be easily controlled to avoid the excessive thinning that may cause collapse during digging of the trenches or in subsequent process steps (for example, during epitaxial growth). In the case of fabrication of SOI wafers as described, the control of the thickness of the diaphragms is particularly important also in view of the subsequent steps of annealing and of thermal oxidation. Thicknesses that are too great or, on the other hand, too small could in fact cause an incomplete oxidation of the diaphragms or lack of uniformity of the buried dielectric layer, which could include residual cavities of significant dimensions.

Finally, it is evident that modifications and variations may be made to the process described herein, without departing from the scope of the present invention as defined in the annexed claims. In particular, in each digging cycle, the sequence of steps of passivation and directional etching can be repeated an arbitrary number of times before the polymerizing etch is carried out (or after it has been carried out). Consequently, the length of the sequences of steps of passivation and directional etching may be constant in each digging cycle, but different with respect to what is described above, or else, it can vary from one digging cycle to another.

Semiconductor structures or bodies formed according to embodiments of the invention can be utilized in a variety of different types of applications, such as forming SOI wafers. Devices such as thin film transistors (TFTs) can then be formed in and/or on the epitaxial layer 15 of such SOI structures. Such devices can form a variety of different types of electronic circuits, such as image capture circuits, memory circuits, and processing circuits which, in turn, can be contained in electronic devices and systems such as digital still and video cameras, cellular phones, personal digital assistants, and computer systems.

The invention claimed is:

1. A method for digging a deep trench in a body of semiconductor material, comprising:
   on a surface of a semiconductor body, forming a mask having at least one opening;
   forming a passivating layer conformally on said mask and on said semiconductor body within said opening; and
   executing a directional etch so as to first remove said passivating layer at least from above said semiconductor body and then etch said semiconductor body through said opening;
   wherein said steps of forming a passivating layer and executing a directional etch are carried out repeatedly in sequence so as to form a first portion of a trench through said opening, said first portion of said trench including at least one corrugated spacing portion having a width increasing as a distance from said surface increase; and
   further comprising executing a polymerizing plasma etch in the first portion of said trench, said polymerizing plasma etch including simultaneously etching the semiconductor body while forming a protective layer of increasing thickness on side surfaces of the opening to form a tapered second portion of said trench, having a traverse dimension decreasing as a distance from said surface increases.

2. The method of claim 1, wherein a plurality of digging cycles is executed and wherein each digging cycle comprises:
   a predetermined number of said steps of forming the first portion; and
   a step of forming the second portion.

3. The method of claim 2, wherein three said digging cycles are carried out.

4. The method of claim 2, wherein said predetermined number is equal to eight.

5. The method of claim 1, wherein said executing a polymerizing plasma etch comprises controlling an angle of inclination of the side surfaces of said second portion of said trench, wherein the angle of inclination ($\alpha$) is configured for the increased width (W').

6. The method of claim 5, wherein said angle of inclination is substantially constant and is equal to approximately 85° with respect to said surface of said semiconductor body.

7. The method of claim 2, wherein said plurality of digging cycles form one rectilinear trench (10), and wherein the method further comprises forming a plurality of rectilinear and parallel trenches, separated from one another by diaphrams of semiconductor material.

8. The method of claim 7, comprising the step of growing an epitaxial layer starting from said diaphragms, so as to close said trenches and form buried cavities.

9. The method of claim 8, comprising a step of annealing of said wafer, for redistributing the semiconductor material of said diaphrams.

10. The method of claim 9, comprising the step of thermally oxidizing said diaphrams to fill the buried cavities (13) with silicon oxide and forming a buried dielectric layer (18).

11. A method for digging a deep trench in a body of semiconductor material, the semiconductor material having a surface and a mask formed on the surface, the mask having at least one opening and the method comprising:
   conformally forming a passivating layer on the mask and on portions of the semiconductor body exposed within each opening;
   performing a directional etch to remove the passivating layer from the portions of the semiconductor body exposed within each opening and to remove the semiconductor body through the opening to form a first portion of a trench, said first portion of said trench including at least one corrugated spacing portion having a width increasing as a distance from said surface increases; and
   performing a polymerizing plasma etch to remove portions of the semiconductor body in the trench and form each deep trench, said polymerizing plasma etch including simutaneously etching the semiconductor body while forming a protective layer of increasing thickness on side surfaces of the opening to form a tapered second portion of said trench, having a transverse dimention decreasing as a distance from said surface increase.

12. The method of claim 11, wherein the operations of conformally forming a passivating layer and performing a directional etch are repeated a number of times.

13. The method of claim 12, wherein the completion of all the operations comprises a cycle and wherein the process further comprises performing several cycles of these operations to form the deep trenches.

14. The method of claim 13, wherein within each cycle the operation of performing a polymerizing plasma etch is performed after the operations of conformally forming the passivating layer and performing the directional etch have been repeated the number of times.

15. The method of claim 13, wherein within each cycle the operation of performing a polymerizing plasma etch is performed prior to the operations of conformally forming the passivating layer and performing the directional etch have been repeated the number of times.

16. The method of claim 11, wherein performing the polymerizing plasma etch comprises performing a shallow trench isolation etch.

17. The method of claim 1, wherein said forming of the protective layer on said side surfaces has a rate of deposition prevailing over a rate of etching of said etching of the semiconductor body.

18. The method of claim 1, wherein said executing of the directional etch is performed using $SF_6$.

19. The method of claim 1, further comprising, after forming of said first and second portions, removing of said mask and said protective layer.

20. The method of claim 10, wherein said thermally oxidizing of said diaphragms to fill the buried cavities with silicon oxide forms a Silicon-On-Insulator wafer.

* * * * *

UNITED STATES PATENT AND TRADEMARK OFFICE
CERTIFICATE OF CORRECTION

PATENT NO. : 7,544,620 B2
APPLICATION NO. : 11/648838
DATED : June 9, 2009
INVENTOR(S) : Roberto Colombo Page 1 of 1

It is certified that error appears in the above-identified patent and that said Letters Patent is hereby corrected as shown below:

Col. 5, line 57, claim 1 "...surface increase..." should read --...surface increases...--.

Col. 6, line 11, claim 5 "...is configured for..." should read --...is configured to compensate for...--.

Col. 6, line 17, claim 7 "...one rectilinear trench (10),..." should read --...one rectilinear and parallel trench (10),...--.

Col. 6, lines 19-20, claim 7 "...by diaphrams..." should read --...by diaphragms...--.

Col. 6, line 26, claim 9 "...said diaphrams. ..." should read --...said diaphragms. ...--.

Col. 6, line 28, claim 10 "...said diaphrams..." should read --...said diaphragms...--.

Col. 6, line 49, claim 11 "...a transverse dimention..." should read --...a transverse dimension...--.

Signed and Sealed this

Twenty-second Day of September, 2009

David J. Kappos
*Director of the United States Patent and Trademark Office*